United States Patent
Vinet et al.

(10) Patent No.: US 11,737,375 B2
(45) Date of Patent: Aug. 22, 2023

(54) DEVICE INCLUDING ELEMENTS FOR COMPENSATING FOR LOCAL VARIABILITY OF ELECTROSTATIC POTENTIAL

(71) Applicants: COMMISSARIAT A L'ENERGIE ATOMIQUE ET AUX ENERGIES ALTERNATIVES, Paris (FR); CENTRE NATIONAL DE LA RECHERCHE SCIENTIFIQUE, Paris (FR)

(72) Inventors: Maud Vinet, Grenoble (FR); Benoît Bertrand, Grenoble (FR); Tristan Meunier, Grenoble (FR)

(73) Assignees: COMMISSARIAT A L'ENERGIE ATOMIQUE ET AUX ENERGIES ALTERNATIVES, Paris (FR); CENTRE NATIONAL DE LA RECHERCHE SCIENTIFIQUE, Paris (FR)

( * ) Notice: Subject to any disclaimer, the term of this patent is extended or adjusted under 35 U.S.C. 154(b) by 0 days.

(21) Appl. No.: 17/717,754

(22) Filed: Apr. 11, 2022

(65) Prior Publication Data
US 2022/0359809 A1 Nov. 10, 2022

(30) Foreign Application Priority Data

May 7, 2021 (FR) .................................... 21 04871

(51) Int. Cl.
*G06N 10/40* (2022.01)
*H10N 60/10* (2023.01)
(Continued)

(52) U.S. Cl.
CPC ........... *H10N 60/128* (2023.02); *G06N 10/20* (2022.01); *G06N 10/40* (2022.01); *H03K 17/92* (2013.01);
(Continued)

(58) Field of Classification Search
CPC ...................................................... G06N 10/40
(Continued)

(56) References Cited

U.S. PATENT DOCUMENTS

2022/0292384 A1* 9/2022 Bertrand ........... H01L 29/42312

OTHER PUBLICATIONS

French Preliminary Search Report dated Dec. 10, 2021 in French Application 21 04871 filed on May 7, 2021, 2 pages (with English Translation of Categories of Cited Documents).
(Continued)

*Primary Examiner* — Tomi Skibinski
(74) *Attorney, Agent, or Firm* — Oblon, McClelland, Maier & Neustadt, L.L.P.

(57) ABSTRACT

A device including a semiconductor layer comprising first regions delimited by second regions and third regions; first electrostatic control gates including first conductive portions extending parallel to each other, in vertical alignment with the second regions; second electrostatic control gates including second conductive portions extending parallel to each other, in vertical alignment with the third regions; wherein each first gate includes an electrostatic control voltage adjustment element forming two impedances connected in series, one end of one of the impedances being coupled to the first conductive portion of the first gate and one end of the other of the impedances being coupled to a third conductive portion applying an adjustment electric potential to the second impedance, and wherein the value of at least one of the impedances is adjustable.

16 Claims, 6 Drawing Sheets

(51) Int. Cl.
  *G06N 10/20* (2022.01)
  *H03K 17/92* (2006.01)
  *H10N 60/01* (2023.01)
  *H10N 69/00* (2023.01)

(52) U.S. Cl.
  CPC ............. *H10N 60/01* (2023.02); *H10N 60/11* (2023.02); *H10N 69/00* (2023.02)

(58) Field of Classification Search
  USPC ........................................................ 327/527
  See application file for complete search history.

(56) References Cited

OTHER PUBLICATIONS

Veldhorst et al., "Silicon CMOS architecture fora spin-based quantum computer", arxiv.org, Sep. 30, 2016, 13 pages.

Boter et al., "A sparse spin qubit array with integrated control electronics", 2019 IEEE International Electron Devices Meeting (IEDM), Dec. 7, 2019, 4 pages.

\* cited by examiner

DEVICE INCLUDING ELEMENTS FOR COMPENSATING FOR LOCAL VARIABILITY OF ELECTROSTATIC POTENTIAL

TECHNICAL FIELD AND PRIOR ART

This document relates to the field of electrostatic control gate devices, and applies especially to the field of quantum devices, quantum information processing and quantum computing.

Quantum computing is based on the use of a quantum state with two measurable levels as an information vector, called qubit or quantum bit, and the laws of quantum mechanics (superposition, entanglement, measurement) in order to execute algorithms. A quantum device with spin qubits allows the quantum state of these qubits to be manipulated.

Spin qubits can be formed in semiconductor, advantageously silicon. Semiconductor technologies are studied for making qubits because of their high integration potential, similar to conventional electronics. Electrons or holes are individually confined in quantum wells located in a cryostat at cryogenic temperatures (below 4K, or even below 1K) and made within electrostatically defined confinement structures of nanometric size and, in the case of silicon, with an architecture close to that of MOSFETs. These confinement structures are called quantum dots. A quantum dot acts as a potential well confining one or more elementary charges (electrons or holes) in a semiconductor region.

The application of a static magnetic field (for example between 100 mT and 1 T) makes it possible to lift the spin degeneracy of the quasiparticles, thus forming a quantum system with two measurable levels, called "spin down" and "spin up". The quantum state of the quantum system is a superposition of these two states represented by the direction of an arrow within a sphere, called Bloch sphere. The manipulation (rotation) of these spins is performed using an alternating component of the magnetic field (with a frequency for example between 1 GHz and several tens of GHz) or using an alternating electric field at the same frequencies in the case of a sufficient spin-orbit interaction (case of holes in silicon for example). The reading of the (up or down) spins makes it possible to extract part of the quantum information according to its probability to be in each state, determined by the quantum superposition.

To obtain good performance with a large number of qubits, qubits are preferably arranged in the form of a 2D array, with potential barriers separating the qubits. These barriers and quantum wells are defined by locally applying electrostatic potentials to the semiconductor regions in which the barriers and wells are formed. With such an arrangement, controlling N qubits individually requires making at least N electrostatic control gates. However, this is problematic when the number of qubits becomes large, for example more than 100.

To solve the problem of the number of control gates to be made, it has been provided to make these gates in the form of a grid arranged parallel to the semiconductor layer used to form the qubits. First gates include first conductive portions arranged in rows and second gates include second conductive portions arranged in columns. The first and second conductive portions are made in two distinct levels and separated from each other by a dielectric layer. The individual control of each qubit is possible by simultaneously controlling the four potential barriers around each qubit, via the electrostatic potentials applied by the four gates formed around the qubit to be controlled.

This row and column architecture of the gates dictates the parallel control of all the tunnel barriers of the same row or column via the application of a single electric potential on the conductive portion forming the control gate of these tunnel barriers. This implies that the operating points of the qubits are known and contained within a small bias range. However, the disorder generated especially by the densities of states at the interface between the semiconductor, in which the potential barriers and the quantum dots are formed, and the gate dielectrics, but also by the charges present in the gate dielectrics or the fluctuations of the output work of the gates, induces local modifications of the electrostatic potential which prevent the charges from being confined in the same way inside the quantum dots. This observed local stochastic disorder is of the same order of magnitude as the confinement voltages and is therefore particularly troublesome as it prevents the use of a wide bias range for all qubits.

Document J. M. Boter et al, "A sparse spin qubit array with integrated control electronics," 2019 IEEE International Electron Devices Meeting (IEDM), San Francisco, Calif., USA, 2019, pp. 31.4.1-31.4.4, describes a solution providing that, in order to take local variability into account, each qubit has its own bias voltage generation unit, allowing it to locally generate voltages that are adapted to each local disorder configuration. However, this requires that the qubits be moved away from each other by a distance of a few microns. This distance being too large for the qubits to interact with each other, it is therefore necessary to add a long distance transport module for the quantum information to move the qubits to a place of interaction during operations between two qubits. This solution has several drawbacks:
- the feasibility of the long distance communication module in silicon has not been demonstrated;
- the solution provided dictates making digital-to-analogue converters and analogue-to-digital converters in the form of local electronic blocks leading to a high energy consumption. It further dictates to operate the device at high temperature (beyond 1K), which has the counterpart of degrading the device performance;
- the number of interconnecting wires coming out of the quantum chip is higher than the row and column architecture of the gates, which potentially leads to an increase in cryogenic power consumption, an increase in noise and an increase in the complexity of the assemblies.

Document M. Veldhorst et al, "Silicon CMOS architecture for a spin-based quantum computer," Nat Commun 8, 1766 (2017), provides, to correct local variability, the application of a local voltage to each qubit. This voltage is applied via a transistor connected to a capacitor which is accessed by virtue of a transistor located over the plane of qubits, in the interconnections. However, this solution is difficult to implement because of the small dimensions required for making the transistors. Indeed, the pitch of a qubit array is in the order of 100 nm. The provided solution requires making, in the interconnection levels, four transistors for each qubit, which is not feasible with current technologies.

Similar problems to those set out above for quantum devices also arise for other types of electrostatic control gate devices.

DISCLOSURE OF THE INVENTION thus there is a need to provide an electrostatic control gate device in which local variability of electrostatic potential is compensated for, and which does not have the drawbacks of the previously described devices of prior art.

For this, one embodiment provides a device including at least:
- a semiconductor layer comprising first regions, second regions arranged such that each of the first regions is delimited by two of the second regions aligned parallel to a first direction and that two of the neighbouring first regions aligned parallel to the first direction are delimited by one of the second regions, and third regions arranged such that each of the first regions is delimited by two of the third regions aligned parallel to a second direction different from the first direction (and not parallel to the first direction) and that two of the first regions aligned parallel to the second direction are delimited by one of the third regions;
- first electrostatic control gates including first conductive portions extending parallel to the second direction, in vertical alignment with the second regions;
- second electrostatic control gates including second conductive portions extending parallel to the first direction, in vertical alignment with the third regions;
- wherein each first gate includes an electrostatic control voltage adjustment element forming first and second impedances connected in series to each other through their first ends, a second end of the first impedance being electrically coupled to the first conductive portion of the first gate and a second end of the second impedance being electrically coupled to a third conductive portion configured to apply an adjustment electric potential to the second end of the second impedance, and wherein the value of at least one of the first and second impedances is adjustable.

In this device, it is provided to compensate for local variability, in each first region of the semiconductor layer, by virtue of an adjustment element for the electrostatic control voltage applied by each first gate. This adjustment element allows for local application of an adjustment electric potential, thereby electrostatically controlling each of the second regions of the semiconductor layer by taking local variability into account.

In the device set out above, the first conductive portions are disposed in vertical alignment with the second regions. In other words, considering projections of the first conductive portions and the second regions in a plane parallel to the front face of the semiconductor layer and passing through this front face, at least part of these projections are superimposed. The same is true for the second conductive portions which are disposed in vertical alignment with the third regions.

A quantum device is also provided, including at least:
- a qubit array made in a semiconductor layer and arranged in rows and columns, each qubit comprising at least one quantum dot;
- first potential barriers arranged such that each quantum dot is delimited by two first potential barriers aligned parallel to the qubit columns and that two neighbouring quantum dots of the same column are delimited by a first potential barrier, and whose potential energy levels are controlled by first electrostatic control gates including first conductive portions extending parallel to the qubit rows;
- second potential barriers arranged such that each quantum dot is delimited by two second potential barriers aligned parallel to the qubit rows and that two neighbouring quantum dots of the same qubit row are delimited by a second potential barrier, and whose potential energy levels are controlled by second electrostatic control gates including second conductive portions extending parallel to the qubit columns;
- wherein each first gate includes an electrostatic control voltage adjustment element forming first and second impedances connected in series to each other through their first ends, a second end of the first impedance being electrically coupled to the first conductive portion of the first gate and a second end of the second impedance being electrically coupled to a third conductive portion configured to apply an adjustment electric potential to the second end of the second impedance, and wherein the value of at least one of the first and second impedances is adjustable.

Throughout the document, the terms "row" and "column" have been chosen and arbitrarily associated with the first and second potential barriers and the conductive portions of the first and second gates. In a plane, the term "row" is generally associated with a horizontal arrangement and the term "column" is generally associated with a vertical arrangement. However, these terms should not be construed solely in terms of this arrangement, but as referring, in a plane, to two different orientations, for example substantially perpendicular to each other. For example, the term "row" may be associated, in a plane, with a vertical arrangement, and the term "column" may be associated with a horizontal arrangement.

Throughout the document, the term "conductive" should be construed to mean "electrically conductive".

The third conductive portions may extend parallel to the first direction.

Considering the device set out above, the electrostatic control voltage adjustment elements of the first gates controlling the potential energy levels of first potential barriers delimiting the quantum dots of a same qubit column may include a third conductive portion common to these elements and extending parallel to the qubit columns.

The device may further include first dielectric portions each disposed between one of the third conductive portions and one of the second conductive portions, each second conductive portion may be disposed between the semiconductor layer and one of the first dielectric portions.

The device may further include second dielectric portions each disposed between one of the third conductive portions and the first conductive portions.

The electrostatic control voltage adjustment element in each first gate may include a memory element forming one of the first and second impedances whose value is adjustable.

In this case, in each first gate, the memory element may be directly in contact with the third conductive portion or the first conductive portion.

The electrostatic control voltage adjustment element in each first gate may include a fourth conductive portion comprising a first end electrically coupled to the memory element and:
- a second end electrically coupled to the first conductive portion of said first gate when the memory element is directly in contact with the third conductive portion, and forming the other of the first and second impedances, or
- a second end electrically coupled to the third conductive portion of said first gate when the memory element is directly in contact with the first conductive portion, and forming the other of the first and second impedances.

In the above configuration, the other of the first and second impedances is formed at the interface between the fourth conductive portion and the first or third conductive portion. The fixed value of this other of the first and second impedances may be adjusted by surface treatment or dielectric deposition.

The first and second gates may include gate dielectrics formed by a same gate dielectric layer disposed between the second conductive portions and the semiconductor layer and between the fourth conductive portions and the semiconductor layer.

The memory elements may be OxRAM or FeRAM or PCRAM type non-volatile memories.

The first regions may be arranged in rows and columns, and the first direction may be perpendicular to the second direction.

In a particular configuration:
the device corresponds to a quantum device;
the first regions form quantum dots;
the second regions form first potential barriers; and
the third regions form second potential barriers.

A method for making a device is also provided, comprising at least the implementation of the following steps from a semiconductor layer comprising first regions, second regions arranged such that each of the first regions is delimited by two of the second regions aligned parallel to a first direction and that two of the neighbouring first regions aligned parallel to the first direction are delimited by one of the second regions, and third regions arranged such that each of the first regions is delimited by two of the third regions aligned parallel to a second direction different from the first direction and that two of the first regions aligned parallel to the second direction are delimited by one of the third regions:

making, on the semiconductor layer, first electrostatic control gates including first conductive portions extending parallel to the second direction, in vertical alignment with the second regions;

making, on the semiconductor layer, second electrostatic control gates including second conductive portions extending parallel to the first direction, in vertical alignment with the third regions;

wherein each first gate includes an electrostatic control voltage adjustment element forming first and second impedances connected in series to each other through their first ends, a second end of the first impedance being electrically coupled to the first conductive portion of the first gate and a second end of the second impedance being electrically coupled to a third conductive portion, and wherein the value of at least one of the first and second impedances is adjustable.

A method for making a quantum device is also provided, comprising at least the implementation of the following steps of:

making, in a semiconductor layer, a qubit array arranged in rows and columns, each qubit comprising at least one quantum dot;

making first potential barriers arranged such that each quantum dot is delimited by two first potential barriers aligned parallel to the qubit columns and that two neighbouring quantum dots of the same column are delimited by a first potential barrier, and whose potential energy levels are controlled by first electrostatic control gates including first conductive portions extending parallel to the qubit rows;

making second potential barriers arranged such that each quantum dot is delimited by two second potential barriers aligned parallel to the qubit rows and that two neighbouring quantum dots of the same row are delimited by a second potential barrier, and whose potential energy levels are controlled by second electrostatic control gates including second conductive portions extending parallel to the qubit columns;

wherein each first gate includes an electrostatic control voltage adjustment element forming first and second impedances connected in series to each other through their first ends, a second end of the first impedance being electrically coupled to the first conductive portion of the first gate and a second end of the second impedance being electrically coupled to a third conductive portion configured to apply an adjustment electric potential to the second end of the second impedance, and wherein the value of at least one of the first and second impedances is adjustable.

The second gates and third conductive portions may be made by implementing the following steps of:

making, on the semiconductor layer, a stack of layers comprising at least, in this order, a gate dielectric layer disposed against the semiconductor layer, a first conductive layer, a first dielectric layer, a second conductive layer and a second dielectric layer;

etching the stack of layers with a stop on the gate dielectric layer, such that the remaining portions of the stack of layers form the second conductive portions disposed against the semiconductor layer, first dielectric portions disposed on the second conductive portions, third conductive portions disposed on the first dielectric portions, and second dielectric portions disposed on the third conductive portions.

The method may further include, after making the second gates and the third conductive portions:

making dielectric spacers against side faces of the remaining portions of the stack of layers;

etching, for example laterally directionally or laterally isotropically etching, part of the dielectric spacers located against one of the side faces of the remaining portions of the stack of layers, forming access to a side face of each third conductive portion;

conformally depositing a third conductive layer, covering the remaining portions of the stack of layers, the dielectric spacers, parts of the gate dielectric layer not covered by the remaining portions of the stack of layers and the dielectric spacers, and said side face of each third conductive portion;

etching the third conductive layer such that remaining portions of the third conductive layer extend parallel to the qubit rows and include portions disposed over the second regions;

depositing a third dielectric layer on the remaining portions of the third conductive layer, on parts of the gate dielectric layer not covered by the remaining portions of the stack of layers, the dielectric spacers, and the remaining portions of the third conductive layer, and on parts of the remaining portions of the stack of layers and the dielectric spacers not covered by the remaining portions of the third conductive layer;

planarising the third dielectric layer and the remaining portions of the third conductive layer with a stop on the second dielectric portions, making third dielectric portions and fourth conductive portions forming the other of the first and second impedances.

In a first embodiment, the method may further include, after planarising the third dielectric layer and the remaining portions of the third conductive layer:

removing part of the fourth conductive portions, forming cavities, part of the side walls of which are formed by said side face of each third conductive portion;

making, in the cavities, memory elements each being part of the electrostatic control voltage adjustment element of one of the first gates and electrically coupled to a first end of the fourth conductive portion of said electrostatic control voltage adjustment element, and fourth dielectric portions disposed on the memory elements;

making the first conductive portions such that they are in contact with second ends of the fourth conductive portions.

In a second embodiment, the method may further include, after planarising the third dielectric layer and the remaining portions of the third conductive layer:

removing part of the fourth conductive portions, forming cavities, part of the side walls of which are formed by said side face of each third conductive portion;

depositing fourth dielectric portions in the cavities;

making memory elements each being part of the electrostatic control voltage adjustment element of one of the first gates and electrically coupled to a first end of the fourth conductive portion of said electrostatic control voltage adjustment element;

making the first conductive portions such that they are in contact with the memory elements.

A method for controlling a device as previously set out is also provided, wherein:

the device forms a quantum device;
the first regions form quantum dots;
the second regions form first potential barriers; and
the third regions form second potential barriers;

and wherein the value of said at least one of the first and second impedances is adjusted and electric potentials are applied to the first and second gates to control the quantum dots.

Generally, throughout the document, the term "layer" should be understood to mean either a single layer of material or a stack of several distinct layers of material.

BRIEF DESCRIPTION OF THE DRAWINGS

The present invention will be better understood upon reading the description of exemplary embodiments given purely by way of illustrating and in no way limiting purposes with reference to the appended drawings in which.

Identical, similar or equivalent parts of the various figures described below bear the same reference numerals so as to facilitate switching from one figure to another.

Figure 1:
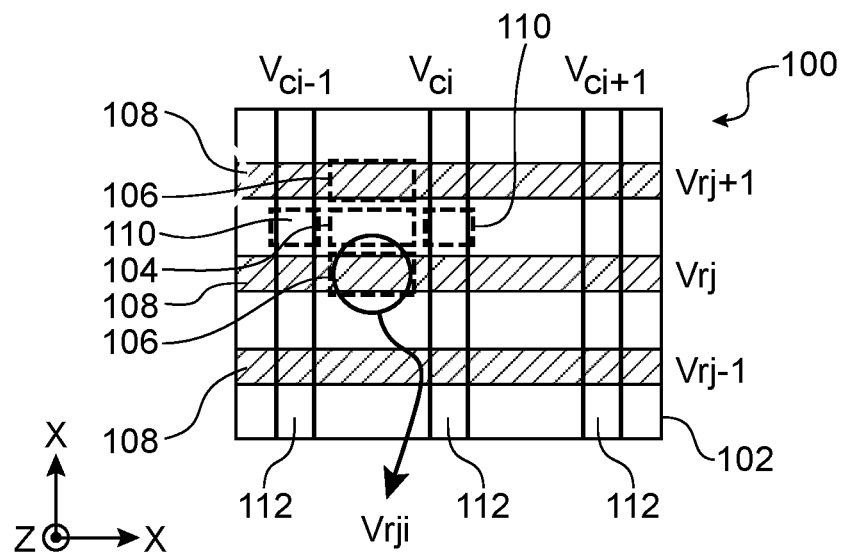
FIG. 1 schematically shows part of a device according to one embodiment.

The various parts shown in the figures are not necessarily represented on a uniform scale, to make the figures more legible.

The different possibilities (alternatives and embodiments) are not to be understood as exclusive of each other and can be combined with each other.

DETAILED DISCLOSURE OF PARTICULAR EMBODIMENTS

A device 100 including elements for compensating for local variability of electrostatic potential is described below in connection with FIG. 1. In the exemplary embodiment described herein, the device 100 corresponds to a qubit array quantum device.

The device 100 includes a semiconductor layer, or substrate, 102 comprising first regions 104, second regions 106, and third regions 110. The second regions 106 are arranged such that each of the first regions 104 is delimited by two of the second regions 106 aligned parallel to a first direction and that two of the neighbouring first regions 104 aligned parallel to the first direction are delimited by one of the second regions 106. The third regions 110 are arranged such that each of the first regions 104 is delimited by two of the third regions 110 aligned parallel to a second direction different from the first direction and that two of the first regions 104 aligned parallel to the second direction are delimited by one of the third regions 110.

The layer 102 includes, for example, silicon, germanium or SiGe. Other semiconductors may be used. Alternatively, the layer 102 may correspond to a stack of several layers each comprising silicon and/or germanium, or other semiconductor materials. The thickness of the layer 102 may be between 5 nm, for example when the layer 2 corresponds to a surface layer of an SOI substrate, and 775 µm, for example when the layer 102 corresponds to a bulk substrate or a heterostructure.

In the exemplary embodiment described herein, a qubit array is made in the semiconductor layer 102, and arranged in rows (parallel to the axis X in the exemplary embodiment of FIG. 1) and columns (parallel to the axis Y in the exemplary embodiment of FIG. 1). The rows are parallel to the second direction, and the columns are parallel to the first direction. The number of rows and/or the number of qubit columns in this array may be between 3 and 10000.

Each first region 104 of the layer 102 forms, in the described exemplary embodiment, at least one quantum dot. In FIG. 1, one of the first regions 104 is symbolically represented by dotted lines.

The second regions 106 of the layer 102 form, in the described exemplary embodiment, first potential barriers. These first barriers are arranged such that each quantum dot is delimited by two of the first barriers aligned parallel to the qubit columns and that two neighbouring quantum dots of the same qubit column are delimited by one of the first barriers.

In FIG. 1, two second regions 106 are symbolically represented by dotted lines.

Potential energy levels of the second regions 106 are controlled by first electrostatic control gates especially including first conductive portions 108 extending parallel to the second direction, namely, parallel to the qubit rows in the described exemplary embodiment. In FIG. 1, three first conductive portions 108 are shown. The first conductive portions 108 each have, for example, a thickness (dimension parallel to the axis Z shown in FIG. 1) between 5 nm and 200 nm and a width (dimension parallel to the axis Y in FIG. 1) between 10 nm and 50 nm. For example, the first conductive portions 108 are made with a pitch between 30 nm and 120 nm. The first conductive portions 108 are arranged in vertical alignment with the second regions 106.

The third regions 110 of the layer 102 form, in the described exemplary embodiment, second potential barriers. These second barriers are arranged such that each quantum dot is delimited by two of the second barriers aligned parallel to the qubit rows and that two neighbouring quantum dots of the same qubit row are delimited by one of the second barriers.

In FIG. 1, two third regions 110 are symbolically represented by dotted lines.

Potential energy levels of the third regions 110 are controlled by second electrostatic control gates including especially second conductive portions 112 extending parallel to the first direction, namely, parallel to the qubit columns in the exemplary embodiment described herein. In FIG. 1, three second conductive portions 112 are shown. The second conductive portions 112 each have, for example, a thickness (dimension parallel to the axis Z shown in FIG. 1) between 5 nm and 200 nm and a width (dimension parallel to the axis X in FIG. 1) between 10 nm and 50 nm. For example, the second conductive portions 112 are made with a pitch between 30 nm and 120 nm. According to one exemplary embodiment, each of the second conductive portions 112 includes a stack of a portion of metal, advantageously a superconducting metal, such as TiN or NbN, with a thickness of between 1 nm and 50 nm, advantageously between 2 nm and 5 nm, and a portion of polysilicon of between 2 nm and 50 nm, advantageously between 5 nm and 10 nm. The second conductive portions 112 are arranged in vertical alignment with the third regions 110.

Locations and dimensions of the second and third regions 106, 110 are determined by the locations and dimensions of the first and second electrostatic control gates. In addition, the locations and dimensions of the first regions 104 are determined by the locations and dimensions of the second and third regions 106, 110.

Although not visible in FIG. 1, the first conductive portions 108 are formed in a distinct and electrically insulated level from that in which the second conductive portions 112 are made.

Distinct electric potentials are applied to each of the first and second conductive portions 108, 112 to electrostatically control each of the first and second barriers formed by the second and third regions 106, 110.

In order to correct local variability of electrostatic potential at each qubit in the array, each first gate includes an electrostatic control voltage adjustment element to adjust the potential electrostatically controlling each of the first barriers 106.

Figure 2:
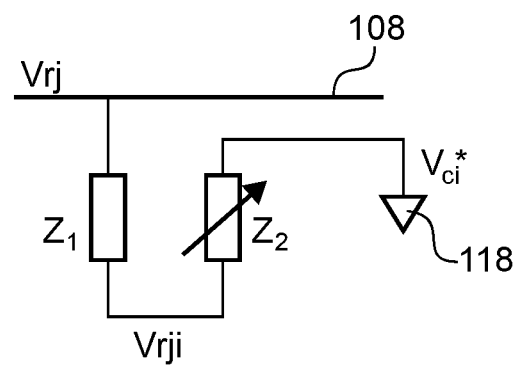
FIGS. 2 and 3 schematically show the operating principle of a first electrostatic control gate of a device according to first and second embodiments.

FIG. 2 schematically represents the operating principle of one of the first gates of the device 100 according to a first embodiment.

In the device 100, a constant electric potential is applied to each first conductive portion 108. This potential is the same for all first gates in the row that include this first conductive portion 108. In the example shown in FIG. 2, this electric potential is referred to as Vrj. By virtue of the electrostatic control voltage adjustment element present in each first gate, the value of this electric potential is adapted locally at each of the first gates so that the value of the electric potential electrostatically controlling the potential energy level in the corresponding second region 106 corrects local variability in that region.

In the example shown in FIG. 2, this adaptation of Vrj is made by an element forming first and second impedances Z1 and Z2 connected in series to each other at their first ends. The potential Vrj is applied to the second end of the first impedance Z1. An electric potential Vci* is applied to the second end of the second impedance Z2 from a third conductive portion 118. This electric potential Vci* is the same for all the first gates aligned along the first direction, namely, being for example on the same column. This electric potential Vci* has a double role: firstly, it is used to programme the value of the memory element, and secondly, it participates in the definition of the potential Vrji defined below. It can advantageously be biased to ground in this second step. The adapted electric potential electrostatically controlling the potential energy level of the first barrier 106 corresponds to the potential called "Vrji" obtained at the first ends of the first and second impedances Z1 and Z2 and which is equal to:

$$Vr_{ji} = \frac{Z_2}{(Z_1 + Z_2)}(Vr_j - Vc_i^*)$$

In the first embodiment shown in FIG. 2, the value of the second impedance Z2 is adjustable and that of the first impedance Z1 is constant.

Figure 3:
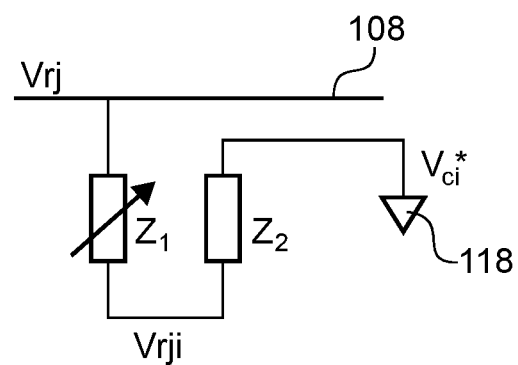

FIG. 3 schematically represents the operating principle of one of the first gates of the device 100 according to a second embodiment. This operation is similar to that described above in connection with FIG. 2, except that the value of the first impedance Z1 is adjustable and that of the second impedance Z2 is constant.

Figure 4:
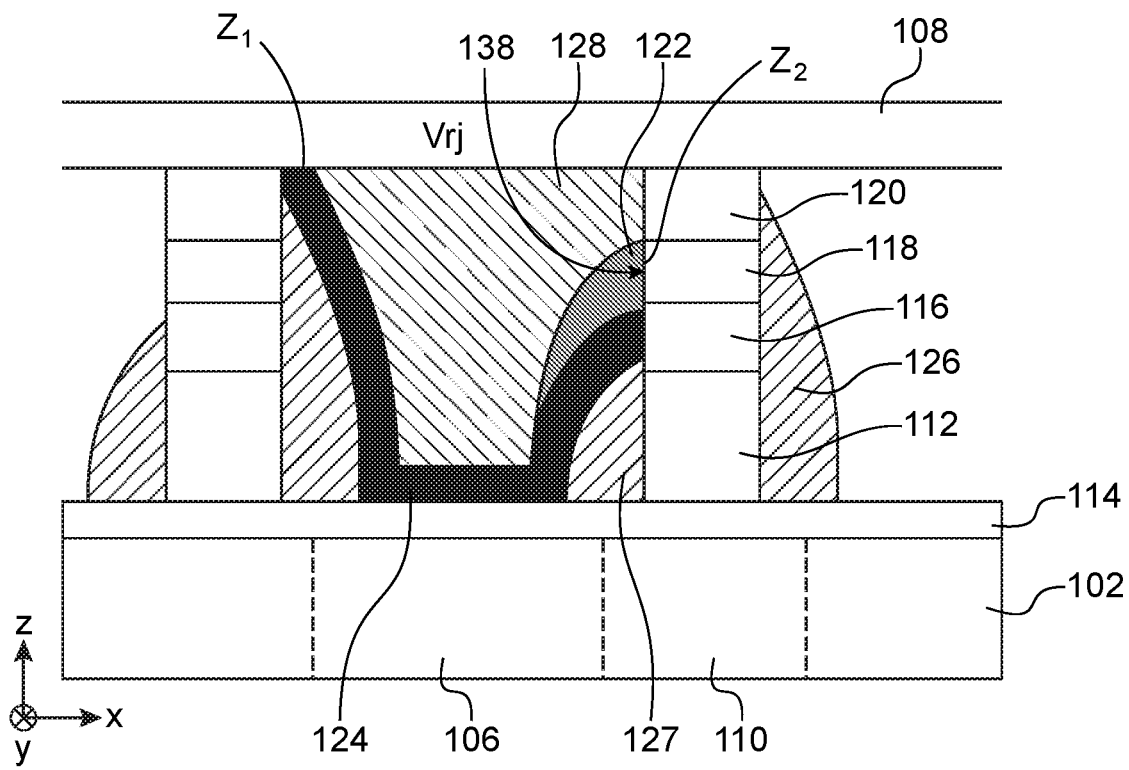
FIGS. 4 and 5 schematically show two exemplary embodiments of the first electrostatic control gate of a device according to first and second embodiments.

FIG. 4 schematically shows one exemplary embodiment of one of the first gates of the device 100 according to the first embodiment.

A gate dielectric layer 114 is disposed on the semiconductor layer 102. The gate dielectric layer 114 includes, for example, $SiO_2$ and has, for example, a thickness of between 2 nm and 20 nm. This gate dielectric layer 114 is used to form the gate dielectrics of the first and second gates, and may cover the entire surface of the semiconductor layer 102. Alternatively, this layer 114 may include a stack of semiconductors for forming a potential barrier between the conductive layers formed on the layer 114 and the semiconductor layer 102 in which the quantum dots are formed. This stack of semiconductors may contain SiGe layers ranging in thickness from 5 nm to 50 nm with % Ge ranging from 10% to 50%.

The second conductive portions 112 are disposed on this gate dielectric layer 114. In the schematic of FIG. 4, the second conductive portions 112 extend parallel to the axis Y (they include a larger dimension parallel to the axis Y), namely, here parallel to the qubit columns of the device 100.

First dielectric portions 116 are disposed on the second conductive portions 112. The first dielectric portions 116 include $SiO_2$, for example. The thickness (dimension parallel to the axis Z) of each of the first dielectric portions is, for example, between 5 nm and 50 nm, and advantageously between 5 nm and 15 nm.

The third conductive portions 118 are disposed on the first dielectric portions 116 which provide electrical insulation between the second and third conductive portions 112, 118. These third conductive portions 118 have, for example, similar materials and dimensions to the second conductive portions 112.

Second dielectric portions 120 are disposed on the third conductive portions 118. The first conductive portions 108 rest partially on the second dielectric portions 120, which thus provide electrical insulation between the first and third conductive portions 108, 118. These second dielectric portions 120 include, for example, $SiO_2$, $SiN$, or $Al_2O_3$, and have, for example, a thickness (dimension parallel to the axis Z) between 10 nm and 100 nm, and advantageously between 5 and 30 nm.

In the exemplary embodiment described herein, the first and second dielectric portions 116, 120 and the third conductive portions 118 have, in the plane (X, Y), a similar shape and dimensions to the second conductive portions 112. Thus, in the schematic of FIG. 4, the first and second dielectric portions 116, 120 and the second and third conductive portions 112, 118 extend parallel to the axis Y, namely, here parallel to the first direction or, in the described exemplary embodiment, to the qubit columns of the device 100.

The electrostatic control voltage adjustment elements of the first gates controlling the potential energy levels in the second regions 106 delimiting first regions 104 aligned parallel to the first direction, namely, of a same qubit column in the example described herein, include one of the third conductive portions 118 that extends parallel to the qubit columns and is common to the first gates of a same column. These third conductive portions 118 are used to apply the electric potential Vci* intended especially to compensate for local variability at the qubit controlled by each of the first gates. The value of this electric potential will be the same for all the first gates that share a same third conductive portion 118.

The voltage adjustment element of each of the first gates also includes a memory element 122. In the first embodiment described herein, the memory element 122 forms the second impedance Z2 whose value is adjustable. This memory element 122 is electrically coupled to the third conductive portion 118 at one of the side faces 138 (faces parallel to the plane (Y, Z) in the example in FIG. 4) of the third conductive portion 118. The memory element 122 is directly in contact with the third conductive portion 118.

According to a particular exemplary embodiment, the memory element 122 may be a resistive non-volatile memory of the OxRAM (oxide-based resistive random access memory) type, corresponding in this case to a variable resistance, or of the FeRAM (ferro-electric random access memory) or PCRAM (phase-change random access memory) type, corresponding in this case to a variable capacitor. The memory element 122 corresponds, for example, to a portion of $HfO_2$ or $HfZrO_2$ or any other dielectric material having memory effects, covered with a metal electrode comprising, for example, Ti.

The voltage adjustment element of each of the first gates also includes a fourth conductive portion 124. In the exemplary embodiment of FIG. 4, the first impedance Z1 whose value is constant corresponds to the contact resistance between the fourth conductive portion 124 and the first conductive portion 108. The fourth conductive portion 124, in contact with the memory element 122, forms a second metal electrode in contact with the memory effect dielectric material portion of the memory element 122. The fourth conductive portion 124 advantageously includes a superconducting material such as TiN, NbN or Nb or Ti or a stack of several of these materials (and advantageously with Ti which provides oxygen vacancies subsequently used for the memory effect of the memory element 122). The use of a superconducting material to form the fourth conductive portion 124 ensures a constant value of the potential that will control the first barriers 106. The fourth conductive portion 124 may be derived from a layer of material conformally deposited with a thickness between 2 nm and 20 nm, and advantageously equal to 5 nm.

Further to these elements, the device 100 includes dielectric spacers 126, 127 disposed against side faces of stacks formed of the second and third conductive portions 112, 118 and the first and second dielectric portions 116, 120. The dielectric spacers 126, 127 include, for example, SiN and/or $SiO_2$ and/or a low dielectric permittivity material such as SiCO or SiCBN. For each of these stacks, one of the dielectric spacers 127 is partially etched such that one of the side faces 138 of each third conductive portion 118 is not covered by this spacer 127 and is in electrical contact with one of the memory elements 122.

The device 100 also includes third dielectric portions 128 that especially provide electrical insulation between the memory elements 122 and the first conductive portions 108. The third dielectric portions 128 include, for example, $SiO_2$.

Further to the first and second impedances Z1 and Z2 formed in this structure, an impedance leakage path Z3 may form between the end of the fourth conductive portion 124 coupled to the memory element 122 and the third conductive portion 118. In order to have the value of the impedance Z3 much larger than those of the impedances Z1 and Z2, to avoid malfunctions of the device 100, the fourth conductive portion 124 is made so that it is far away from and well electrically insulated from the third conductive portion 118, as will be described later in connection with the method for making the device 100.

Figure 5:
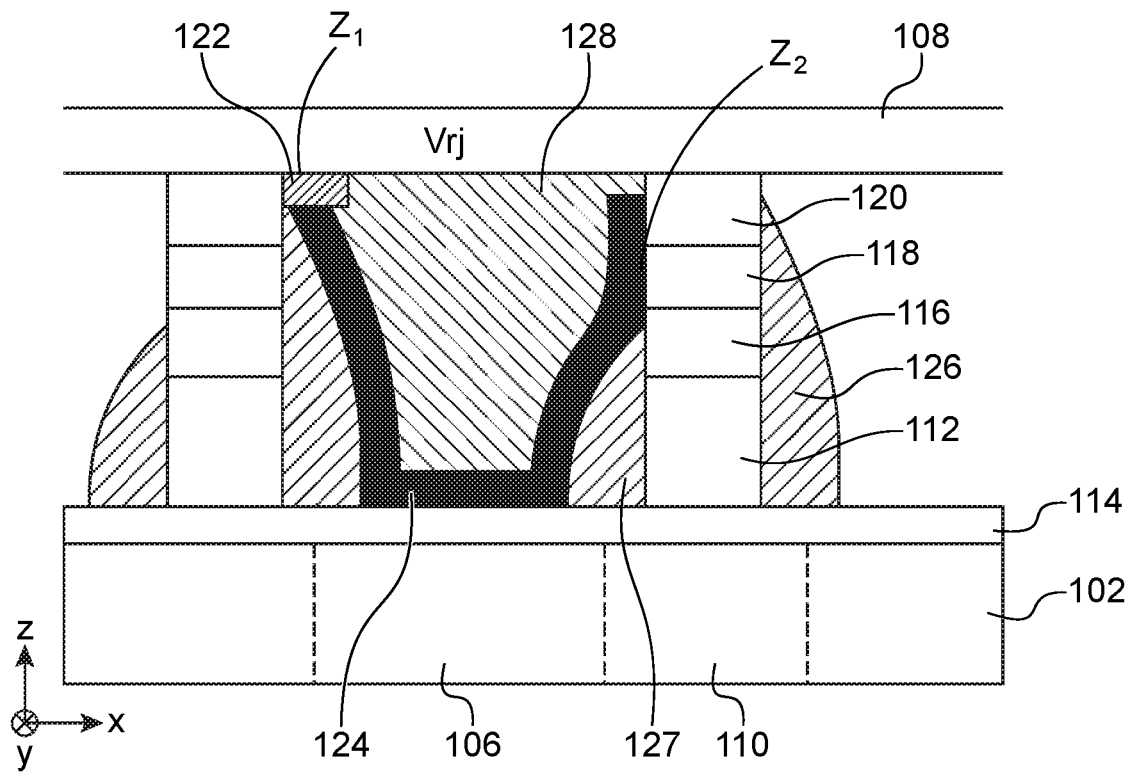

FIG. 5 schematically shows one exemplary embodiment of one of the first gates of the device 100 according to the second embodiment.

Each of the first gates of the device 100 according to the second embodiment includes all of the elements previously described for the first gates of the device 100 according to the first embodiment. However, in this second embodiment, in each voltage adjustment element of the first gates, the memory element 122 is not directly in contact with the third conductive portion 118 but with the first conductive portion 108. Further, the fourth conductive portion 124 is directly coupled to the third conductive portion 118.

Thus, in this second embodiment, the value of the impedance Z1, formed by the memory element 122, is adjustable and that of the impedance Z2, formed by the contact resistance between the third and fourth conductive portions 118, 124, is constant.

By way of example, regardless of the exemplary embodiment of the device 100:
the value of the potential Vrji may be between −1V and 1V;
the value of the variable value impedance, formed by the memory element 122, may be between a few k$\Omega$ and a few G$\Omega$;
the value of the constant value impedance, formed by the contact resistance between the fourth conductive portion 124 and the third conductive portion 118 or the first conductive portion 108, may be between a few k$\Omega$ and a few M$\Omega$, for example between 5k$\Omega$ and 5M$\Omega$.

In order to be able to compensate for local variability in each first region 104, the values of the variable impedance as well as the values of the potentials Vci* to be applied should be determined. For this purpose, it is for example possible to:
first characterise all the first semiconductor regions 104 via the implementation of stability diagram measurements performed by using the first and second gates of the device 100, for the purpose of determining which voltage levels applied to these gates allow access to the charge energies and input voltages of the first electron, namely, allowing an initialization of the qubits with one electron per quantum dot in the example described herein. Moreover, this characterization step can also allow the determination of the individual bias voltages that will allow the control of each qubit;

individually programme the variable impedances formed by the memory elements 122, via the application of voltages across the same through the first, third and fourth conductive portions 108, 118, 124, to allow each locally applied potential Vrji to lead to the same configuration of the control potential of the second and third regions 106, 110 for the applied voltages Vrj and Vci;

during operation of the device 100, apply the calculated voltage levels Vrj, Vci, and Vci* to obtain local variability compensation for each first region 104.

By way of example, the determination of the one-electron regime of each quantum dot may be obtained by virtue of the implementation of a protocol of charge detections within the quantum dots. For this purpose, it is possible to integrate charge detectors (for example single electron transistors, or SETs) near the qubits. These detectors provide information on the number of charges confined in the surrounding quantum dots. By measuring, for example, the current flowing through an SET at the same time as the voltages applied to the first and second gates of a quantum dot with which this SET is associated are varied, it is possible to trace the voltage ranges for which a single electron is well confined in this quantum dot. If this voltage range is incompatible with the one determined for another quantum dot sharing these control gates, namely being on the same row or column, the programming of the variable impedances Z1 and Z2 will remedy this. Other techniques are possible to determine the number of charges contained in a quantum dot, for example via the use of a resonant circuit ("reflectometry circuit") connected to a control gate.

A method for making the device 100 according to the first embodiment is described below in connection with FIGS. 6 to 13.

Figure 6:
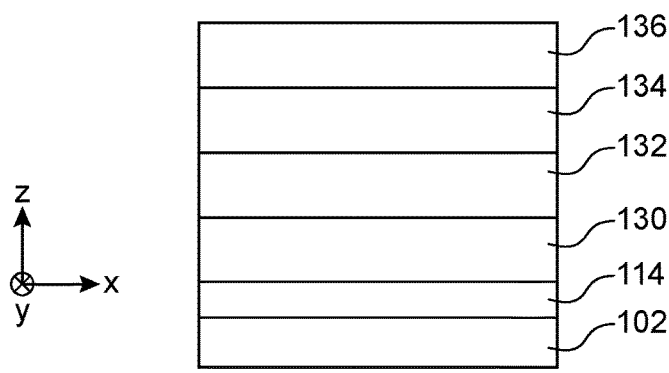
FIGS. 6, 7A, 7B, 8A, 8B, 9A, 9B, 10A, 10B, 11A, 11B, 12, and 13 schematically show steps of a method for making a device according to the first embodiment.
Figure 7A:
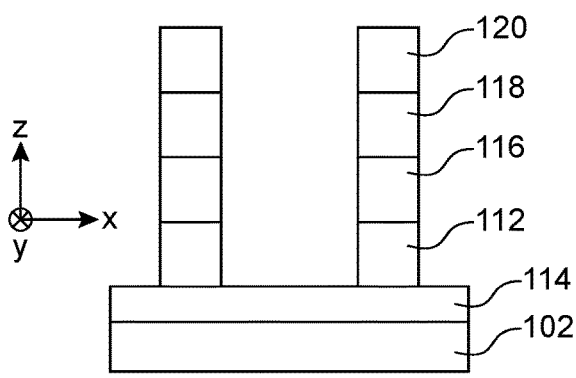
Figure 7B:
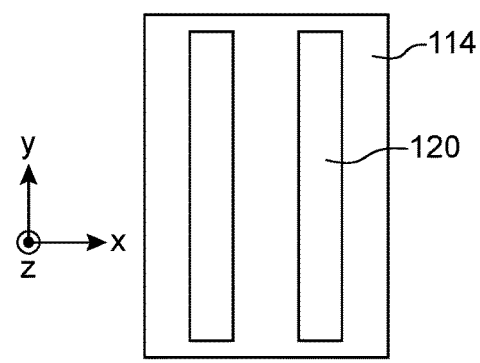

A stack of layers, for making the gate dielectric layer 114, the first and second dielectric portions 116, 120 and second and third conductive portions 112, 118, is made on the layer 102 (see FIG. 6).

The gate dielectric layer 114 is first made on the layer 102, for example by thermal oxidation.

A first conductive layer 130, formed of one or more stacked conductive materials, is then deposited on the gate dielectric layer 114.

A first dielectric layer 132 is then made on the first conductive layer 130.

A second conductive layer 134, formed of one or more stacked conductive materials, is then deposited on the first dielectric layer 132.

A second dielectric layer 136 is made on the second conductive layer 134. This second dielectric layer 136 is intended to form the second dielectric portions 120, but will also be used to make an etch mask and also used as a stop layer for implementing planarisation.

This stack is etched, first by forming an etch mask from the second dielectric layer 136, and then etching the remaining layers of the stack until the gate dielectric layer 114 is reached. The remaining portions of the stack form the first and second dielectric portions 116, 120 and the second and third conductive portions 112, 118 (see FIGS. 7A and 7B, corresponding to a cross-section view and a top view, respectively, of the structure obtained at this stage of the method).

Figure 8A:
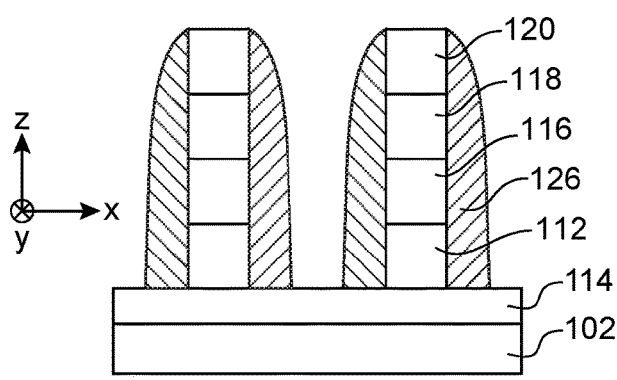
Figure 8B:
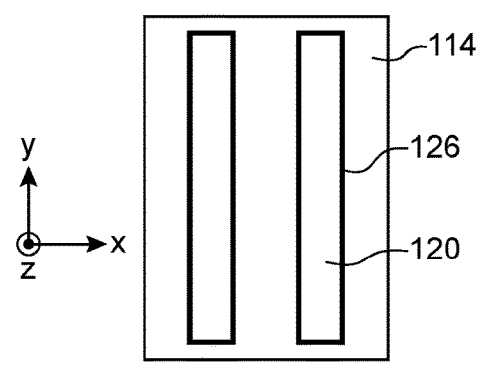

The dielectric spacers 126 are then made by depositing at least one dielectric material, and then by etching this or these dielectric materials in order to keep only portions of this or these materials disposed against the lateral flanks of the portions 112, 116, 118, 120 (see FIGS. 8A and 8B).

Figure 9A:
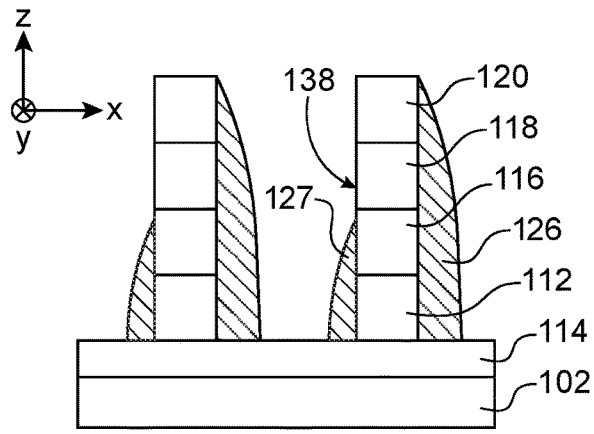
Figure 9B:
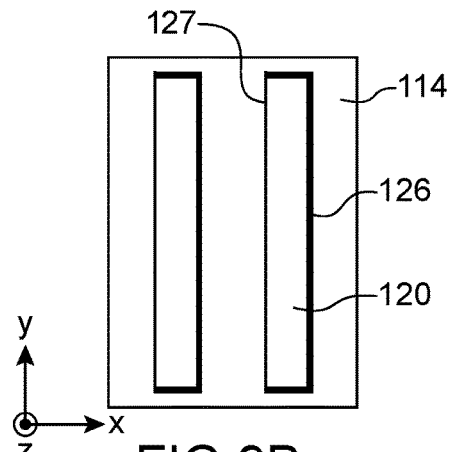
Figure 10A:
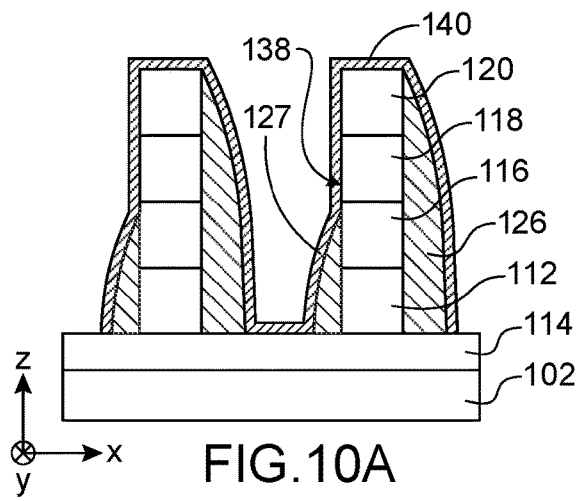
Figure 10B:
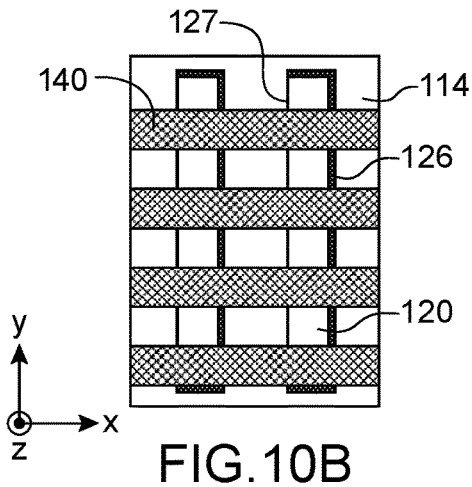
Figure 11A:
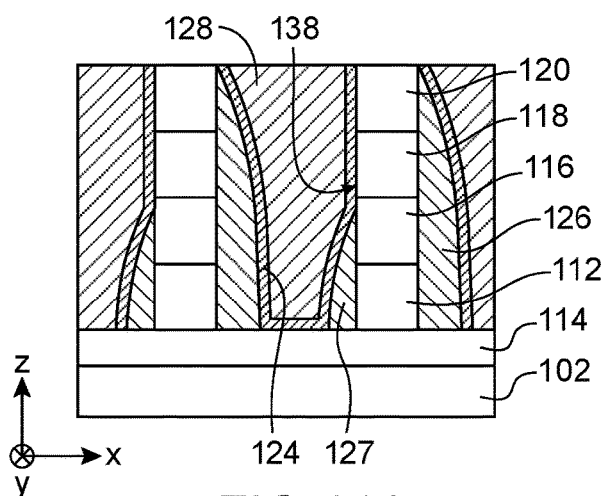
Figure 11B:
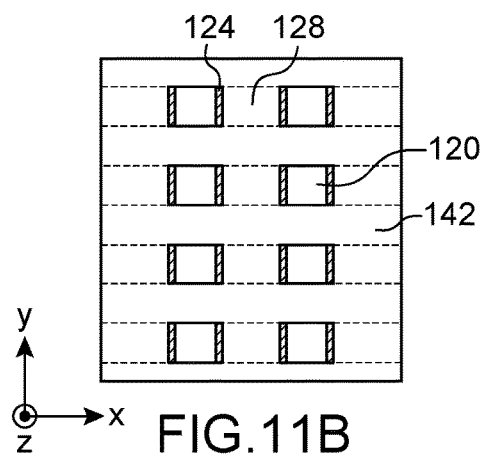
Figure 12:
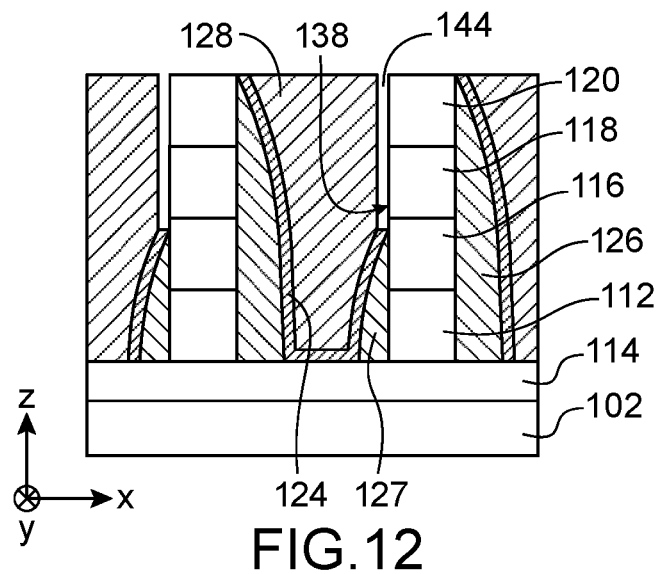
Figure 13:
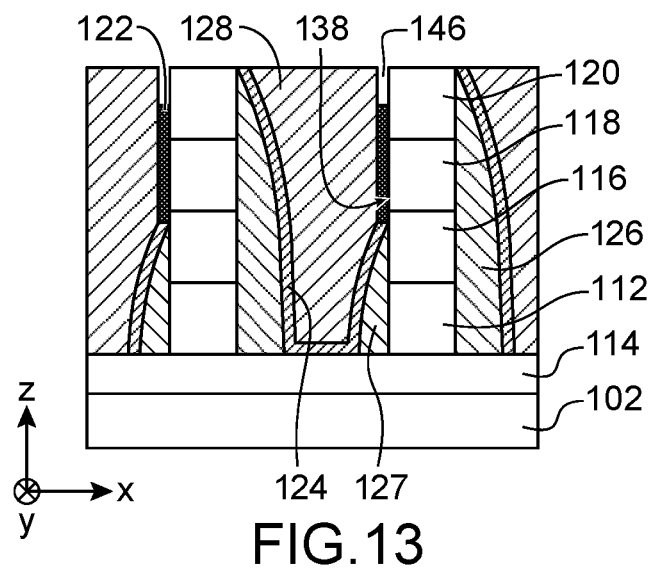

Etching, for example laterally directionally or laterally isotropically etching, of a portion of the spacers 126 located against one of the side faces of portions 112, 116, 118, 120 is implemented, forming access to a side face 138 of each third conductive portion 118. In FIGS. 9A and 9B, the etched spacers are designated by reference 127. Advantageously, this etching may be performed in a self-aligned manner by implementing ion implantation forming a non-zero angle (commonly referred to as a "tilt") with respect to a row perpendicular to the face of the layer 114 on which the spacers 126 rest, or by using a directional plasma and then implementing chemical or reactive ion etching. Alternatively, this etching may be performed by implementing photolithography and etching.

A layer of conductive material, for example metal material and advantageously including a superconducting material, is then conformally deposited, namely by forming a layer of constant thickness on the walls against which this layer is deposited. This layer of conductive material covers the remaining portions 112, 116, 118, 120 of the stack of layers (and especially the side faces 138 of the third conductive portions 118), the dielectric spacers 126, 127, as well as the parts of the gate dielectric layer 114 not covered by the remaining portions 112, 116, 118, 120 and the dielectric spacers 126, 127. This layer of conductive material is intended to form the fourth conductive portions 124. After this deposition, this layer of conductive material is etched so that remaining portions 140 of this layer extending parallel to the qubit rows, and having parts disposed over the regions of the layer 102 in which the first barriers 106 are intended to be formed, are kept (see FIGS. 10A and 10B).

A third dielectric layer 142, including, for example, an oxide such as $SiO_2$, is then deposited over the entire previously made structure, filling the spaces present between the stacks of portions 112, 116, 118 and 120 and covering the remaining portions 140 of the previously deposited layer of conductive material.

A planarisation of this third dielectric layer 142 and of the parts of the remaining portions 140 located on the second dielectric portions 120 is then implemented, stopping on the second dielectric portions 120. The parts of the portions 140 kept after this planarisation form the fourth conductive portions 124, each in electrical contact with one of the third conductive portions 118 through the side face 138. Remaining parts of the third dielectric layer 142 correspond to the third dielectric portions 128 (see FIGS. 11A and 11B).

Parts of the fourth conductive portions 124 are then removed by etching, forming cavities 144 in the layer of dielectric material 142, part of the side walls of which is formed by the side faces 138 of the third conductive portions 118. These cavities 144 allow access to the fourth conductive portions 124 and to the third conductive portions 118 (see FIG. 12). This etching is, for example, preceded by photolithography. The etching implemented is, for example, selective RIE (reactive ion etching) or chemical etching implemented, for example, with a solution of HCl or $H_2O_2$ and whose etching speed is controlled in order to etch these parts of the fourth conductive portions 124 without etching the third conductive portions 118. This etching is stopped when the bottom walls of the cavities 144 reach at least the first dielectric portions 116.

The memory elements 122 are then made in the cavities 144, by depositing, for example, $HfO_2$, $HfZrO_2$, or any other dielectric material having a memory effect, and then a metal electrode comprising, for example, Ti. The memory elements 122 are made without completely filling the cavities 144 in order to limit leakage with the future first conductive portions 108 that will be made later. For this purpose, a distance of at least 5 nm between the top side of the memory elements 122 and the top side of the second dielectric portions 120 may be maintained, for example. The remaining empty spaces over the memory elements 122 are filled with dielectric material, forming fourth dielectric portions 146 arranged on the memory elements 122 (see FIG. 13).

The device 100 is completed by making the first conductive portions 108, for example, by implementing metal deposition, lithography and etching, or by a damascene type deposition method. Prior to this deposition, a surface treatment may be implemented to define fixed values of the impedances Z1 which correspond, in this first embodiment, to the contact resistances between the material of fourth conductive portions 124 and that of the first conductive portions 108. Finally, one or more back-end type interconnection levels are made to allow connections to the various conductive elements of the device 100.

A method for making the device 100 according to the second embodiment is described below.

The steps previously described in connection with FIGS. 6 through 12 are first implemented.

Figure 14:
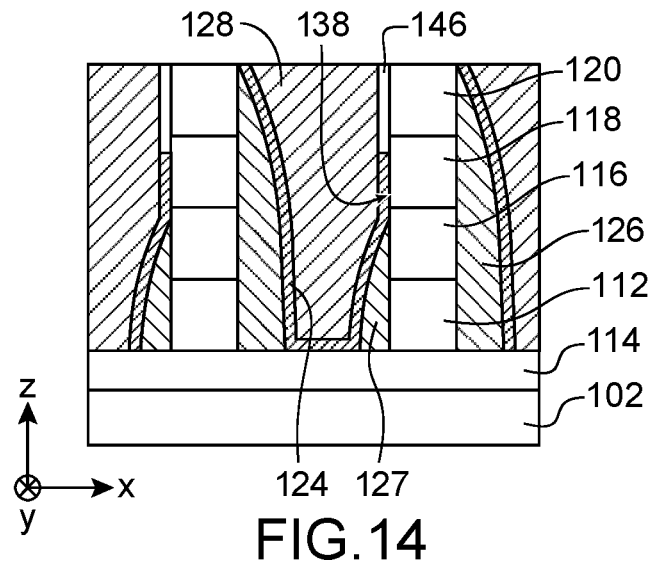
FIGS. 14 and 15 schematically show part of the steps of a method for making a device according to the second embodiment.

The cavities 144 are then filled with a dielectric material, forming the fourth dielectric portions 146 (see FIG. 14).

Figure 15:
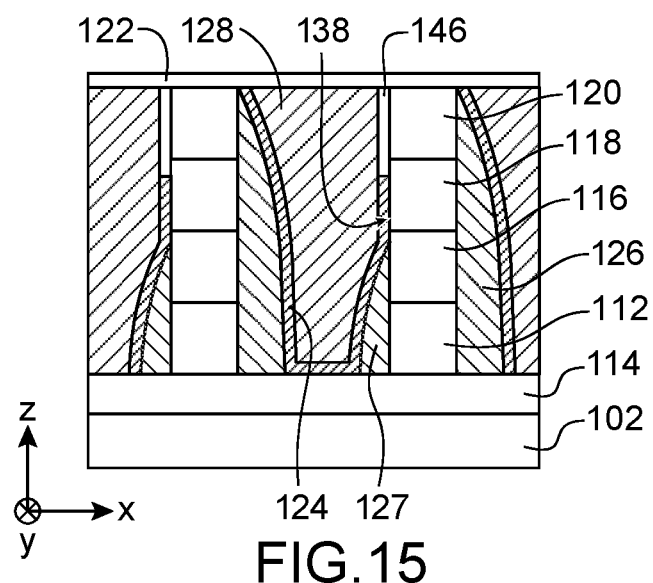

A layer of memory effect dielectric material, for example similar to that previously described for making the memory elements 122 of the device 100 according to the first embodiment, is then deposited (see FIG. 15), and then possibly etched in order to form the memory elements 122 coupled to the fourth conductive portions 124 to obtain a structure as previously described in connection with FIG. 5.

The first conductive portions 108 are then made such that they are in contact with the memory elements 122. In this second exemplary embodiment, the first conductive portions 108 may be made as a stack of several especially incorporating a first layer comprising, for example, Ti and being used as electrodes for the memory elements 122.

The device 100 is completed as in the first embodiment, by making one or more back-end type interconnection levels allowing connections to the various conductive elements of the device 100.

In the different embodiments and examples previously described, it is possible that:
the device 100 corresponds to a quantum device;
the first regions 104 form quantum dots;
the second regions 106 form first potential barriers; and
the third regions 110 form second potential barriers.

Alternatively, the device 100 may correspond to a CMOS type device, with the electrostatic control voltage adjustment element used to modulate the gate voltage of the transistors, or the device 100 may correspond to an image sensor in which the different regions of the layer 102 form diodes.

The invention claimed is:

1. A device including at least:
a semiconductor layer comprising first regions, second regions arranged such that each of the first regions is delimited by two of the second regions aligned parallel to a first direction and that two of the neighbouring first regions aligned parallel to the first direction are delimited by one of the second regions, and third regions arranged such that each of the first regions is delimited by two of the third regions aligned parallel to a second direction different from the first direction and that two of the first regions aligned parallel to the second direction are delimited by one of the third regions;
first electrostatic control gates including first conductive portions extending parallel to the second direction, in vertical alignment with the second regions;
second electrostatic control gates including second conductive portions extending parallel to the first direction, in vertical alignment with the third regions;
wherein each first gate includes an electrostatic control voltage adjustment element forming first and second impedances connected in series to each other through their first ends, a second end of the first impedance being electrically coupled to the first conductive portion of the first gate and a second end of the second impedance being electrically coupled to a third conductive portion, and wherein the value of at least one of the first and second impedances is adjustable.

2. The device according to claim 1, wherein the third conductive portions extend parallel to the first direction.

3. The device according to claim 2, further including first dielectric portions each disposed between one of the third conductive portions and one of the second conductive portions, each of the second conductive portions being disposed between the semiconductor layer and one of the first dielectric portions.

4. The device according to claim 2, further including second dielectric portions each disposed between one of the third conductive portions and the first conductive portions.

5. The device according to claim 1, wherein the electrostatic control voltage adjustment element of each first gate includes a memory element forming one of the first and second impedances whose value is adjustable.

6. The device according to claim 5, wherein, in each first gate, the memory element is directly in contact with the third conductive portion or the first conductive portion.

7. The device according to claim 5, wherein the electrostatic control voltage adjustment element of each first gate includes a fourth conductive portion comprising a first end electrically coupled to the memory element and:
a second end electrically coupled to the first conductive portion of said first gate when the memory element is directly in contact with the third conductive portion, and forming the other of the first and second impedances, or
a second end electrically coupled to the third conductive portion of said first gate when the memory element is directly in contact with the first conductive portion, forming the other of the first and second impedances.

8. The device according to claim 7, wherein the first and second gates include gate dielectrics formed by a same gate dielectric layer disposed between the second conductive portions and the semiconductor layer and between the fourth conductive portions and the semiconductor layer.

9. The device according to claim 5, wherein the memory elements are OxRAM or Fe RAM or PCRAM type resistive non-volatile memories.

10. The device according to claim 1, wherein the first regions are arranged in rows and columns, and wherein the first direction is perpendicular to the second direction.

11. A method for controlling a device according to claim 1, wherein:
the device forms a quantum device;
the first regions form quantum dots;
the second regions form first potential barriers;
the third regions form second potential barriers;
and wherein the value of said at least one of the first and second impedances is adjusted and electric potentials are applied to the first and second gates to control the quantum dots.

12. A method for making a device, comprising at least the implementation of the following steps from a semiconductor layer comprising first regions, second regions arranged such that each of the first regions is delimited by two of the second regions aligned parallel to a first direction and two of the neighbouring first regions aligned parallel to the first direction are delimited by one of the second regions, and third regions arranged such that each of the first regions is delimited by two of the third regions aligned parallel to a second direction different from the first direction and that two of the first regions aligned parallel to the second direction are delimited by one of the third regions:

making, on the semiconductor layer, first electrostatic control gates including first conductive portions extending parallel to the second direction, in vertical alignment with the second regions;

making, on the semiconductor layer, second electrostatic control gates including second conductive portions extending parallel to the first direction, in vertical alignment with the third regions;

wherein each first gate includes an electrostatic control voltage adjustment element forming first and second impedances connected in series to each other through their first ends, a second end of the first impedance being electrically coupled to the first conductive portion of the first gate and a second end of the second impedance being electrically coupled to a third conductive portion, and wherein the value of at least one of the first and second impedances is adjustable.

13. The method according to claim 12, wherein the second gates and the third conductive portions are made by implementing the following steps of:

making, on the semiconductor layer, a stack of layers comprising at least, in this order, a gate dielectric layer disposed against the semiconductor layer, a first conductive layer, a first dielectric layer, a second conductive layer, and a second dielectric layer;

etching the stack of layers with a stop on the gate dielectric layer, such that remaining portions of the stack of layers form the second conductive portions disposed against the semiconductor layer, first dielectric portions disposed on the second conductive portions, the third conductive portions disposed on the first dielectric portions, and second dielectric portions disposed on the third conductive portions.

14. The method according to claim 13, further including, after making the second gates and third conductive portions:

making dielectric spacers against side faces of the remaining portions of the stack of layers;

etching part of the dielectric spacers located against one of the side faces of the remaining portions of the stack of layers, forming access to a side face of each third conductive portion;

conformally depositing a third conductive layer, covering the remaining portions of the stack of layers, the dielectric spacers, parts of the gate dielectric layer not covered by the remaining portions of the stack of layers and the dielectric spacers, and said side wall of each third conductive portion;

etching the third conductive layer such that remaining portions of the third conductive layer extend parallel to the qubit rows and include parts disposed over the second regions;

depositing a third dielectric layer on the remaining portions of the third conductive layer, on parts of the gate dielectric layer not covered by the remaining portions of the stack of layers, the dielectric spacers and the remaining portions of the third conductive layer, and on parts of the remaining portions of the stack of layers and the dielectric spacers not covered by the remaining portions of the third conductive layer;

planarising the third dielectric layer and the remaining portions of the third conductive layer with a stop on the second dielectric portions, making third dielectric portions and fourth conductive portions.

15. The method according to claim 14, further including, after planarising the third dielectric layer and the remaining portions of the third conductive layer:

removing part of the fourth conductive portions, forming cavities, part of the side walls of which are formed by said side face of each third conductive portion;

making, in the cavities, memory elements each being part of the electrostatic control voltage adjustment element of one of the first gates and electrically coupled to a first end of the fourth conductive portion of said electrostatic control voltage adjustment element, and fourth dielectric portions disposed on the memory elements;

making the first conductive portions such that they are in contact with second ends of the fourth conductive portions.

16. The method according to claim 14, further including, after planarising the third dielectric layer and the remaining portions of the third conductive layer:

removing part of the fourth conductive portions, forming cavities, part of the side walls of which are formed by said side face of each third conductive portion;

depositing fourth dielectric portions in the cavities;

making memory elements each being part of the electrostatic control voltage adjustment element of one of the first gates and electrically coupled to a first end of the fourth conductive portion of said electrostatic control voltage adjustment element;

making the first conductive portions such that they are in contact with the memory elements.

* * * * *